(12) United States Patent
Zeng

(10) Patent No.: US 10,875,223 B2
(45) Date of Patent: Dec. 29, 2020

(54) HOUSING, MANUFACTURING METHOD OF THE SAME, AND ELECTRONIC DEVICE

(71) Applicant: GUANGDONG OPPO MOBILE TELECOMMUNICATIONS CORP., LTD., Guangdong (CN)

(72) Inventor: Yuanqing Zeng, Dongguan (CN)

(73) Assignee: GUANGDONG OPPO MOBILE TELECOMMUNICATIONS CORP., LTD., Guangdong (CN)

( * ) Notice: Subject to any disclaimer, the term of this patent is extended or adjusted under 35 U.S.C. 154(b) by 100 days.

(21) Appl. No.: 16/173,940

(22) Filed: Oct. 29, 2018

(65) Prior Publication Data

US 2019/0134867 A1    May 9, 2019

(30) Foreign Application Priority Data

Nov. 6, 2017   (CN) .......................... 2017 1 1078841

(51) Int. Cl.
| | |
|---|---|
| *B32B 27/08* | (2006.01) |
| *B29C 45/14* | (2006.01) |
| *B32B 27/36* | (2006.01) |
| *H05K 5/02* | (2006.01) |
| *B29L 31/34* | (2006.01) |
| *B29K 55/02* | (2006.01) |

(Continued)

(52) U.S. Cl.
CPC .. *B29C 45/14688* (2013.01); *B29C 45/14221* (2013.01); *B29C 45/14811* (2013.01);
(Continued)

(58) Field of Classification Search
CPC .......... B29C 2045/14237; B29C 2045/14868; B29C 2045/14901; B29C 45/14221; B29C 45/14688; B29C 45/14811; B29K 2055/02; B29K 2069/00; B29K 2105/0088; B29K 2995/0088; B29L 2031/3437; B29L 2031/3481; B32B 2451/00; B32B 2457/00; B32B 27/08; B32B 27/365; H05K 5/0243
See application file for complete search history.

(56) References Cited

U.S. PATENT DOCUMENTS

| | | | |
|---|---|---|---|
| 9,778,687 B1 | 10/2017 | Rajagopalan et al. | |
| 2004/0209032 A1 | 10/2004 | Wani et al. | |

(Continued)

FOREIGN PATENT DOCUMENTS

| | | |
|---|---|---|
| CN | 101340469 A | 1/2009 |
| CN | 102299404 A | 12/2011 |

(Continued)

OTHER PUBLICATIONS

China Search Report issued in corresponding China application No. 2017110788414, dated Jun. 10,2019(7 pages).

(Continued)

*Primary Examiner* — Lawrence D Ferguson
(74) *Attorney, Agent, or Firm* — Ladas & Parry, LLP

(57) ABSTRACT

A manufacturing method of a housing includes the following steps: a preformed housing is provided. The preformed housing includes a body and a sidewall connected to the edge of the body, and a decoration film disposed on the body and the sidewall. A portion of the sidewall is exposed from the decoration film. The body includes a first surface. The sidewall includes a second surface. The second surface extends from the first surface. The first surface and the second surface are non-coplanar. A decoration layer is formed on the exposed portion of the sidewall by a surface processing treatment.

19 Claims, 8 Drawing Sheets

(51) Int. Cl.
  *B29K 69/00* (2006.01)
  *B29K 105/00* (2006.01)
(52) U.S. Cl.
  CPC ............ *B32B 27/08* (2013.01); *B32B 27/365* (2013.01); *H05K 5/0243* (2013.01); *B29C 2045/14237* (2013.01); *B29C 2045/14868* (2013.01); *B29C 2045/14901* (2013.01); *B29K 2055/02* (2013.01); *B29K 2069/00* (2013.01); *B29K 2105/0088* (2013.01); *B29K 2995/0088* (2013.01); *B29L 2031/3437* (2013.01); *B29L 2031/3481* (2013.01); *B32B 2451/00* (2013.01); *B32B 2457/00* (2013.01)

(56) References Cited

U.S. PATENT DOCUMENTS

| | | |
|---|---|---|
| 2007/0199797 A1 | 8/2007 | Sell |
| 2012/0074007 A1 | 3/2012 | Drummer |
| 2012/0250250 A1 | 10/2012 | Tatebe |

FOREIGN PATENT DOCUMENTS

| | | |
|---|---|---|
| CN | 104412453 A | 3/2015 |
| CN | 104754897 A | 7/2015 |
| CN | 104972283 B | 10/2015 |
| CN | 106393555 A | 2/2017 |
| CN | 107199287 A | 9/2017 |
| CN | 107241882 A | 10/2017 |
| CN | 108099097 A | 6/2018 |
| EP | 2060381 A1 | 5/2009 |

OTHER PUBLICATIONS

European Search Report issued in corresponding European application No. 18204070, dated Apr. 10,2019(7 pages).

International Search Report and Written Opinion issued in corresponding International application No. 2018113833, dated Jan. 16, 2019(12 pages).

First Office Action and Search Report issued in corresponding China application No. 2017110788414, dated Feb. 26,2019(18 pages).

```
┌─────────────────────────────────────────────────────────────┐
│ A preformed Housing including a body, a sidewall connected  │
│ to the edge of the body, and a decoration film disposed on  │─ 101
│ the body and the sidewall is provided. A portion of the     │
│ sidewall is exposed from the decoration film.               │
└─────────────────────────────────────────────────────────────┘
                              │
                              ▼
┌─────────────────────────────────────────────────────────────┐
│ A decoration layer is formed on the exposed portion of the  │─ 201
│ sidewall                                                     │
└─────────────────────────────────────────────────────────────┘
```

FIG. 1

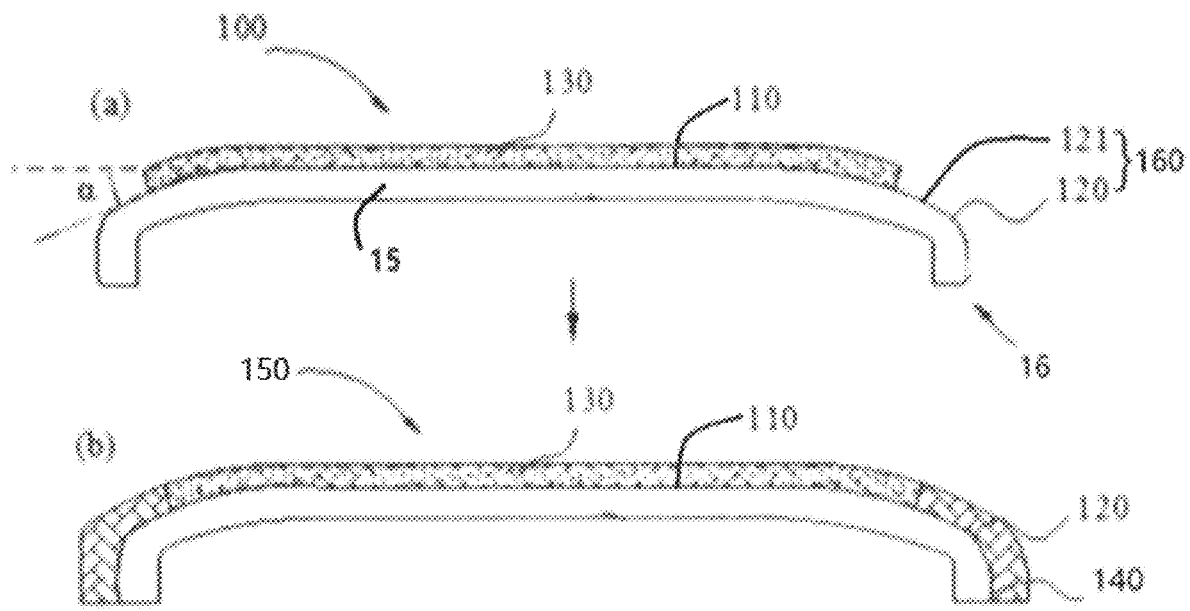

FIG. 2

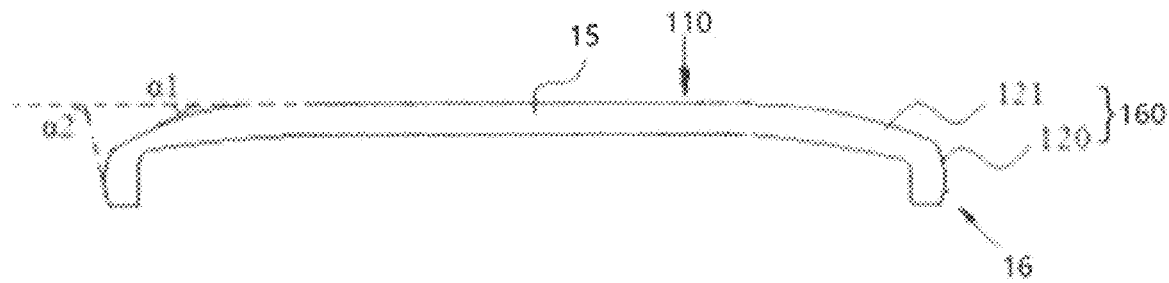

FIG. 3

```
                                                                    410
an initial housing including the body and the sidewall connected to the
              edge of the body is provided 420
an in-mold decoration process is applied to the initial housing to form
    the decoration film disposed on the body and the sidewall
```

HOUSING, MANUFACTURING METHOD OF THE SAME, AND ELECTRONIC DEVICE

CROSS REFERENCE

This application claims priority to a Chinese Patent Application No. 201711078841.4, filed on Nov. 6, 2017, titled "MOBILE TERMINAL HOUSING AND MANUFACTURING METHOD OF THE SAME, IN-MOLD INJECTION MOLD, MOBILE TERMINAL". The entirety of the above-mentioned application is hereby incorporated by reference.

TECHNICAL FIELD

The disclosure relates to the field of electronic equipment. More particularly, and without limitation, the disclosed embodiments relate to a housing, a manufacturing method of the housing, and an electronic device.

DESCRIPTION OF RELATED ART

With the improvement of consumption level, consumers seek diversified functions on industrial products, and have grown demands on the appearance, the texture and the like. For example, more and more current electronic devices such as mobile phones or tablet personal computers having integrated housings. However, current manufacturing methods cannot be suitable for all integrated housings, especially integrated housings with a specific configuration.

SUMMARY

The disclosure relates to a method for manufacturing a housing. According to an embodiment of the disclosure, the method includes the following steps. A preformed housing is provided. The preformed housing includes a body, a sidewall connected to the edge of the body, and a decoration film disposed on the body and the sidewall. A portion of the sidewall is exposed from the decoration film. The body has a first surface. The sidewall includes a second surface. The second surface extends from the first surface. The first surface and the second surface are non-coplanar. A decoration layer is formed on the exposed portion of the sidewall by a surface processing treatment. According to an embodiment of the disclosure, the preformed housing is provided by the following steps. The decoration film is arranged into an in-mold injection mold. An in-mold decoration process is applied to the decoration film to form the body and the sidewall.

The disclosure further relates to a housing. According to an embodiment of the disclosure, the housing includes a body, a sidewall, a decoration film, and a decoration layer. The body includes a first surface. The sidewall is connected to the edge of the body. The sidewall includes a second surface. The second surface extends from the first surface. The first surface and, the second surface are non-coplanar. The decoration film is formed on the body and a portion of the sidewall. The decoration layer is formed on an exposed portion of the sidewall exposed from the decoration film. The decoration film and the decoration layer are formed in two individual processes.

The disclosure further relates to an electronic device. According to an embodiment of the disclosure, the electronic device includes a housing. The housing includes a body, a sidewall, a decoration film, and a decoration layer. The body includes a first surface. The sidewall is connected to the edge of the body, and the sidewall includes a second surface. The second surface extends from the first surface. The first surface and the second surface are non-coplanar. The decoration film is formed on the body and a portion of the sidewall. The decoration layer is formed on a portion of the sidewall exposed from the decoration film.

BRIEF DESCRIPTION OF THE DRAWINGS

FIG. 1 illustrates a flowchart of a method for manufacturing a housing according to a first embodiment of the present disclosure.

FIG. 2 illustrates a structural schematic flowchart of a method for manufacturing a housing according to the first embodiment of the present disclosure.

FIG. 3 illustrates a preformed housing without a decoration film according to the first embodiment of the present disclosure.

DETAILED DESCRIPTION

Figure 4:
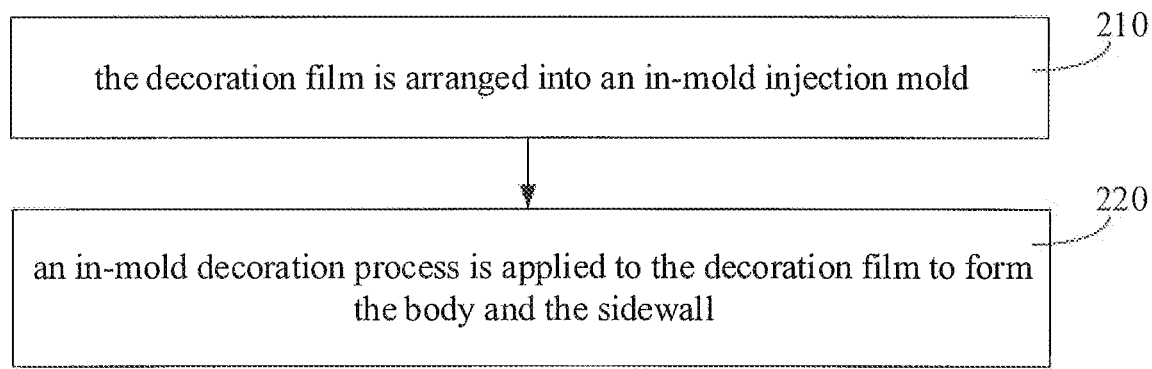
FIG. 4 illustrates a flowchart of a method for manufacturing a housing according to a second embodiment of the present disclosure.

This description and the accompanying drawings that illustrate exemplary embodiments should not be taken as limiting. Various mechanical, structural, electrical, and operational changes may be made without departing from the scope of this description and the claims, including equivalents. In some instances, well known structures and techniques have not been shown or described in detail so as not to obscure the disclosure. Similar reference numbers in two or more figures represent the same or similar elements.

Furthermore, elements and their associated features that are disclosed in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

The disclosure is made based on the fact that the inventor finds and recognizes the following facts and problems:

The inventor finds that a housing of an electronic device with a specific configuration cannot be realized by a current in-mold decoration technology (IMT, also refers to an in-mold decoration process). Through further research and a large number of experiments, the current IMT can only be applied to a flatten surface. When a sidewall of the housing is bent from a body of the housing, especially, the sidewall is extended substantially perpendicular to the body, the decoration film cannot be effectively fixed onto the sidewall of the housing by the current IMT.

The IMT is a novel technology which is combined with a screen-printing process and an injection molding process. When the IMT is used for manufacturing a housing of an electronic device, the screen-printing process is firstly applied to a transparent sheet (a printed material sheet for forming a decoration film). Thus, a pattern can be transferred on the transparent sheet. The transparent sheet with the pattern is processed into the decoration film. The decoration film is placed into an injection mold to form the housing by the in-mold decoration process. The housing may be made of the resin formed on a back surface of the transparent sheet. Then, a polishing treatment and the like can be applied to the housing, so that the housing has a good appearance.

As mentioned above, the housing may include the body and a sidewall. When the sidewall of the housing is bent from the body of the housing, especially, the sidewall is extended substantially perpendicular to the body, the decoration film cannot be effectively fixed onto the sidewall of the housing by the current IMT. Thus, the sidewall cannot have an appearance (for example, structure, color and texture) matched with the appearance of the other parts of the housing. The current IMT cannot be suitable for the housing with a specific configuration.

FIG. 1 illustrates a flowchart of a method for manufacturing a housing of the first embodiment of the present disclosure. The housing may be used for an electronic device such as a mobile terminal. The method can begin at block 101.

At block 101: a preformed housing including a body, a sidewall connected to the edge of the body, and a decoration film disposed on the body and the sidewall is provided. A portion of the sidewall is exposed from the decoration film.

At block 201: a decoration layer is formed on the exposed portion of the sidewall.

At block 101, as illustrated in FIG. 2, especially, in FIG. 2(a), a preformed housing 100 may be provided. The preformed housing 100 may include a body 15, a sidewall 16 connected to the edge of the body 15, and a decoration film 130 disposed on the body 15 and a portion of the sidewall 16. Another portion of the sidewall 16 is exposed from the decoration film 130. The body 15 may have a first surface 110. The sidewall 16 may have a second surface 160. The second surface 160 and the first surface 110 are located at the same side of the preformed housing 100. The second surface 160 extends from the first surface 110. The first surface 110 and the second surface 160 are non-coplanar. In at least one embodiment of the disclosure, the material and the manufacturing method of the preformed housing 100 are not particularly limited. Those of ordinary skill in the art can design and select the material and the manufacturing method of the preformed housing 100 according to the appearance requirements of the finally prepared housing 150 (see FIG. 2(b)) and the requirements of the mechanical strength. In one embodiment, the sidewall 16 may be a whole structure connected to the body 15. In other embodiments, the sidewall 16 may include into a number of individual sidewall parts.

In at least one embodiment of the disclosure, the sidewall 16 may surround the body 15 and extending away from the body 15. The body 15 and the sidewall 16 has different extending directions. For example, the sidewall 16 may be bent relative to the body 15, and an extending direction of the sidewall 16 may be substantially perpendicular to the first surface 110 of the body 15. The first surface 110 of the body 15 may be a plane.

The second surface 160 of the sidewall 16 may include at least two parts. One part is an inclined surface 121, which is directly connected to the first surface 110, and is included relative to the first surface 110. Another part is an extending surface 120, which is directly connected to the inclined surface 121. The extending surface 120 extends in a direction substantially perpendicular to the first surface 110. In one embodiment, an angle of the extending surface 120 and the first surface 110 is larger than an angle of the inclined surface 121 and the first surface 110.

According to the embodiment of the disclosure, the inclined surface 121 is not particularly limited. For example, the inclined surface 121 and the extending surface 122 may be planes or arc surfaces.

In FIG. 3, the preformed housing 100 without the decoration layer 130 is illustrated. An included angle α1 between the inclined surface 121 and the first surface 110 can be defined. A person skilled in the art can understand that the included angle α1 is a constant value. When the inclined surface 121 is an arc surface, the included angle α1 is defined between the first surface 110 and an extension line of the tangent line at any point on the inclined surface 121. A person skilled in the art can understand that the included angle α1 is variable value, according to the specific point on the inclined surface 121.

In one embodiment, the included angle α1 between the inclined surface 121 and the first surface 110 may be either equal to or less than 90 degrees. The included angle α2 between the extending surface 120 of the sidewall 16 and the first surface 110 may be more than 90 degrees.

The exposed portion 160 of the sidewall 16 includes a portion of the inclined surface 121 and the extending surface 120. The exposed portion 160 is finally covered by the decoration layer 140.

According to the specific embodiment of the disclosure, the included angle α2 between the extending surface 120 of the sidewall 16 and the first surface 110 may be more than 113 degrees.

At block 201, as illustrated in FIG. 2, especially, in FIG. 2(b), the decoration layer 140 can be formed on the exposed portion 160 of the sidewall 16, for example, by a surface treatment processing.

According to an embodiment of the disclosure, after the preformed housing 100 including the decoration film 130 is provided, the surface treatment processing may be applied to the exposed portion 160 of the sidewall 16. The surface treatment may be selected from a group of an electroplating, an injection molding, and an anodic oxidation process. As a result, a decoration structure, for example, a decoration layer 140 can be formed on the exposed portion 160 of the sidewall 16. In one embodiment, the decoration layer 140 can be formed by another injection molding process. That is, the decoration layer 140 and the decoration film 130 can be formed in two individual processes. In one embodiment, the decoration layer 140 and the decoration film 130 can be formed in two individual injection molding processes. The material of the decorating, layer 140 may be identical to or different from the material of the decoration film 130. The decorating layer 140 has a good appearance matched with the decoration film 130. The decoration layer 140 can be connected to the decoration film 130 smoothly and firmly.

FIG. 4 illustrates a flowchart of a method for manufacturing a housing of the second embodiment of the present disclosure. The method of providing the preformed housing can begin at block 210.

At block 210, the decoration film is arranged into an in-mold injection mold.

At block 220, an in-mold decoration process is applied to the decoration film to form the body and the sidewall.

Figure 5:
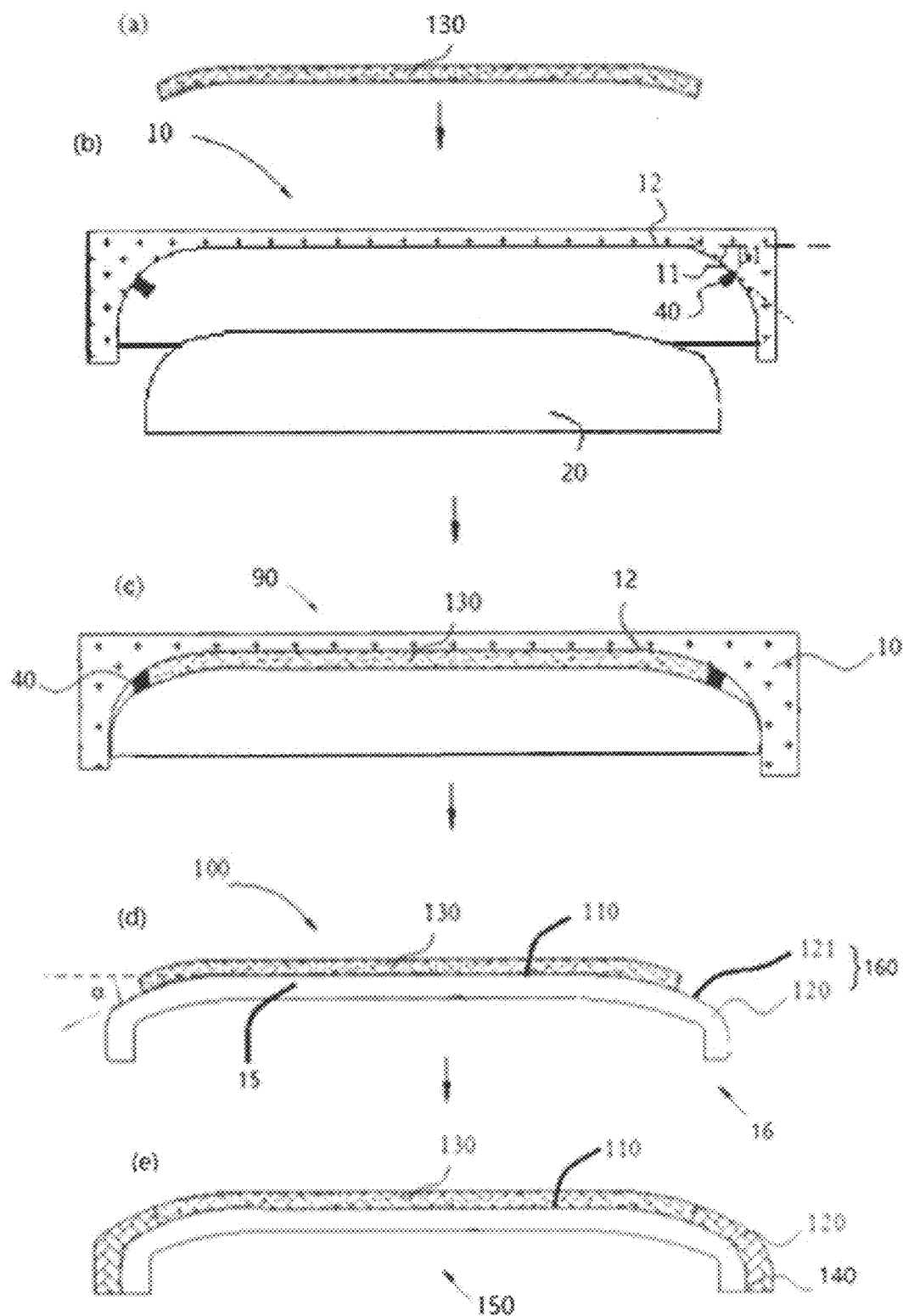
FIG. 5 illustrates a structural schematic flowchart of a method for manufacturing a housing according to the second embodiment of the present disclosure.

In this embodiment, as illustrated in FIG. 5, especially, in FIG. 5(a), a decoration film 130 is prepared before the whole preformed housing 100 is manufactured. The decoration film 130 can be a transparent sheet (a printed material sheet for forming a decoration film).

As illustrated in FIGS. 5(b) and (c), an in-mold injection mold 90 with a positioning element 40 is provided. The in-mold injection mold 90 may include an upper mold 10 and a lower mold 20. A positioning element 40 can be arranged on the upper mold 10. The positioning element 40 can be configured for locating the decoration film 130 and blocking an injection material flowing onto the decoration film 130. The positioning element 40 can be extended from a first central molding surface 12 of the upper mold 10 toward a second central molding surface 21 (see FIG. 6) of the lower mold 20. The upper mold 10, the lower mold 20, and the positioning element 40 can be cooperated to form an injection mold space 30 (see FIG. 6) with a configuration of the preformed housing 100. When the upper mold 10 and the lower mold 20 is cooperated, the positioning element 40 can contact a second central molding surface 22 (see FIG. 7) of the lower mold 20. The injection molding space 30 is defined. According to the embodiment of the disclosure, the positioning element 40 can be configured to keep the injection material from flowing onto the extending surface 120. Thus, the decoration film 130 can only be contacted with the first surface 110, as illustrated in FIG. 5(d).

In the step S220, the in-mold decoration process is applied to the decoration film 130 to form the body 15 and the sidewall 16, and a portion of the sidewall 16 is exposed from the decoration film 130. That is, the decoration film 130 may cover the first surface 110 and the part of the second surface 160 connected to the first surface 110. A boundary position of the decoration film 130 can be related to, but not limited to, the included angle α defined between the first surface 110 and an extension line of the tangent line at a point on the inclined surface 121 corresponding to the boundary of the decoration film 130. As illustrated in FIG. 5(e), the included angle α is either equal to or less than 90 degrees.

In the in-mold decoration process, the decoration film 130 can completely cover the body 15 and partially cover the sidewall 16.

The decoration film 130 partially covers the sidewall 16. The in-mold decoration process may be used to form the body 15 on a substantially flatten surface of the decoration film 130 and the sidewall 16 connected to the edge of the body 15. In the present embodiment, the included angle α1 (see FIG. 3) between the inclined surface 121 and the first surface 110 can be either equal to or less than 90 degrees. The decoration film 130 can be arranged on the inclined surface 121 and the body 110 during the in-mold decoration process. The included angle α2 between the extending surface 120 of sidewall 110 and the first surface 110 can be more than 90 degrees. The extending surface 120 may not be covered by the decoration film 130. That is, the decoration film 130 can cover the whole first surface 110 and a portion of the second surface 160. For example, only the inclined surface 121 or only a portion of the inclined surface 121 can be covered by the decoration film 130. The other portion of the inclined surface 121 not covered and the extending surface 120 of the sidewall 16 is exposed from the decoration film 130.

The decoration film 130 may be firmly arranged on the first surface 110 and a portion of the second surface 160. The decoration film 130 can simply and conveniently be arranged on the body 15 with various appearance. The appearance of the housing 150 can be enriched, and the production cost of the housing 150 can be reduced.

According to the specific embodiment of the disclosure, the thickness of the decoration film 130 may be about 0.36 millimeters.

The body 15 of the preformed housing 100 can be directly formed beneath the decoration film 130 by the in-mold decoration process. A surface processing method can be applied to the preformed housing 150 to form a decoration layer 140 (see FIG. 5(e)). Further, the decoration layer 140 can be connected to the decoration film 130 smoothly and firmly due to the relatively regular boundary of the decoration film 130 and the arc or curve surface 120.

According to the present embodiment of the disclosure, the boundary of the decoration film 130 can be related to, but not limited to, the included angle α defined between the first surface 110 and an extension line of the tangent line at a point on the inclined surface 121 corresponding to the boundary of the decoration film 130. Specifically, the included angle α can be either equal to or less than 66 degrees.

Figure 6:
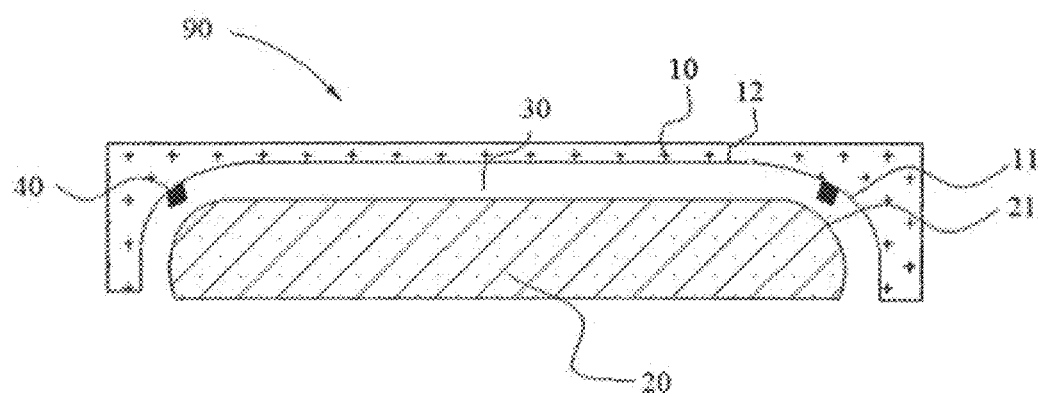
FIG. 6 illustrates a schematic view of an in-mold injection mold according to the second embodiment of the disclosure.
Figure 7:
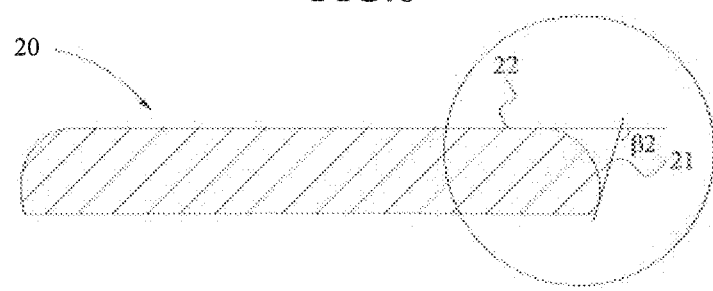
FIG. 7 illustrates a schematic view of a lower mold of the in-mold injection mold according to the second embodiment of the present disclosure.

As illustrated in FIGS. 6-7, the in-mold injection mold 90 includes the upper mold 10, the lower mold 20. The injection molding space 30 can be defined by the upper mold 10 and the lower mold 20. The injection molding space 30 is configured for forming the body 15 and the portion of the sidewall 16 connected to the body 15. An edge of the decoration film 130 can be smooth. The decoration film 130 can be matched with the other layers or structures by another surface treatment. The preformed housing 100 can have good appearance (such as color). For example, there is no color difference between the edge of the decoration film 130 and the decoration layer 140 formed by other surface treatment on the sidewall 16.

A first inclined molding surface 11 located at the edge of the first central molding surface 12 facing the injection molding space 30 of the upper mold 10. A second inclined molding surface 21 located at the second central molding surface 22 facing the injection molding space 30 of the lower mold 20. The first inclined molding surface 11 and the first central molding surface 12 can be divided with the positioning element 40 according to the embodiment of the disclosure. Therefore, by means of the positioning element 40, the decoration film 130 can be simply and conveniently arranged on the predetermined area.

Figure 8:
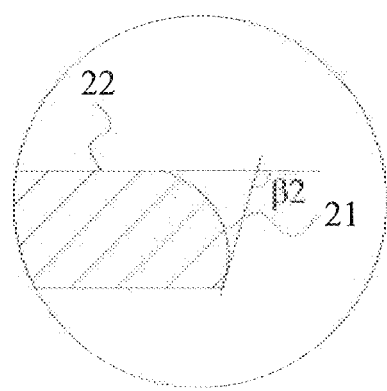
FIG. 8 illustrates a partial enlarged view of the lower mold of the in-mold injection mold according to the second embodiment of the present disclosure.

According to an embodiment of the disclosure, as illustrated in FIG. 7 and FIG. 8, an angle β2 of an extension line of the tangent line at a point on the first inclined molding surface 11 and the first central molding surface 12 of the upper mold is more than 90 degrees. Or, the angle β2 of an extension line of the tangent line at a point on the second inclined molding surface 21 and the second central molding surface 22 of the lower mold 20 is more than 90 degrees. Or, the angle β2 of an extension line of the tangent line at a point on the first inclined molding surface 11 and the first central molding surface 12 of the upper mold is more than 90 degrees and the angle β2 of an extension line of the tangent line at a point on the second inclined molding surface 21 and the second central molding surface 22 of the lower mold 20 is also more than 90 degrees.

Figure 9:
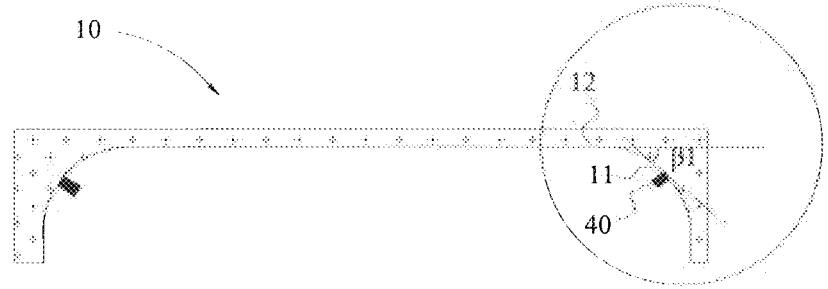
FIG. 9 illustrates a schematic view of an upper mold of the in-mold injection mold according to the second embodiment of the present disclosure.
Figure 10:
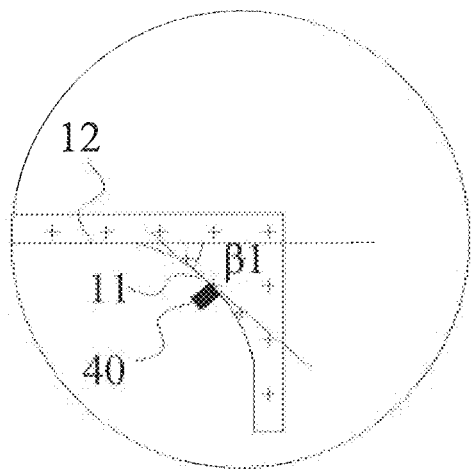
FIG. 10 illustrates a partial enlarged view of an upper mold of the in-mold injection mold according to the second embodiment of the present disclosure.

According to an embodiment of the disclosure, as illustrated in FIG. 9 and FIG. 10, the positioning element 40 can be arranged on the first inclined surface 11 and/or the second inclined surface 21. An angle β1 of an extension line of the tangent line at a separating point of the positioning element 40 on the first inclined molding surface 11 and the first central molding surface 12 of the upper mold 10 is either equal to or less than 90 degrees. Or an angle β1 of an extension line of the tangent line at a separating point of the positioning element 40 on the second inclined molding surface 21 and the second central molding surface 22 of the lower mold 20 is either equal to or less than 90 degrees. Or the angle β1 of an extension line of the tangent line at a separating point of the positioning element 40 on the first inclined molding surface 11 and the first central molding surface 12 of the upper mold 10 is either equal to or less than 90 degrees and the angle β1 of an extension line of the tangent line at a separating point of the positioning element 40 on the second inclined molding surface 21 and the second central molding surface 22 of the lower mold 20 is also either equal to or less than 90 degrees.

According to the embodiment of the disclosure, a plastic material for the in mold decoration process includes polycarbonate (PC), and a melting index of the plastic material can be less than 28 g/10 min. The polycarbonate has a relatively low melting temperature and a relatively good liquidity and can meet the requirements of the injection molding process. When the injection molding process is applied to a sheet with an ink layer, the polycarbonate has an injection performance. A deformation of the sheet and a problem of flushing ink can also be avoided.

It should be noted that, the plastic material is not particularly limited to polycarbonate. The plastic material with the melting index less than 28 g/10 min can also be used in the in-mold injection molding process. For example, the plastic material can also be polymethyl methacrylate (PMMA), polyethylene terephthalate (PET), polystyrene (PS) or the like. According to the embodiment of the disclosure, for example, when the housing 150 of the electronic device such as a mobile phone is manufactured, the plastic material may include PC. According to the embodiment of the disclosure, the melt index of the plastic material can be 18-2800 min. The plastic material can have good liquidity and toughness for the in-mold injection molding process. Therefore, a housing 150 with a specific configuration, for example, a large curvature structure or a complex structure may be manufactured.

It should be noted that the melt index can be obtained by a current testing method. For example, the testing method may include the following steps. The plastic material is melting during a certain period (such as 10 minutes), at a certain temperature and a certain pressure (the certain temperature and the certain pressure can be selected according to various material) to form a plastic fluid. And then, the plastic fluid can flow through a circle tube with a diameter of 2.095 mm. Several grams (g) flowing out of the circle tube per minute can be obtained. The larger the numerical value of the melt index is, the better the fluidity of the plastic material is, and otherwise, the smaller the numerical value of the melt index is, the worse the fluidity of the plastic material is. Therefore, it is necessary for the plastic material for the decoration film 130 has relatively high liquidity. That is, the plastic material or the decoration film 130 has a relatively high melt index.

According to an embodiment of the present disclosure, the plastic material can be made of a first resin and a second resin by a hot melt extrusion process. A molecular weight of the first resin can be greater than a molecular weight of the second resin.

It should be noted that, the molecular weight of the first resin refers the molecular weight of the main polymer of the first resin, and the molecular weight of the second resin refers the molecular weight of the main polymer of the second resin. For example, when the first resin or the second resin is a blend of two or more polymers, the molecular weight of the first resin, and the molecular weight of the second resin, in particular, is the molecular weight of the polymers with the mass content of more than 50% in the resin.

It should be noted that the term "polymer" should be understood broadly. That is, a polymer can be formed by a single monomer or can be a copolymer formed by a number of monomers. A mixing ratio of the first resin and the second resin is not particularly limited. The molecular weight of the first resin can be more than the molecular weight of the second resin, and the melt index of the plastic material is less than 28 g/10 min. A difference of the molecular weights of the main composition in the first resin and the molecular weights of the main composition in the second resin can be related to the meld index of the plastic material. The melt index of the plastic material can be adjusted by the mixing ratio according to the chemical composition of the first resin and the chemical composition of the second resin.

According to an embodiment of the present disclosure, the first resin may be a blend including PC and ABS (Acrylonitrile Butadiene Styrene). The blend of PC and ABS may have a lower melting temperature and a relatively high liquidity, which may meet the requirements of the injection molding process. According to an embodiment of the present disclosure, the second resin may include PC, and the molecular weight of the PC in the second resin can be in a range from 20,000 to 50,000. When the molecular weight of the PC in the second resin is in the range from 20,000 to 50,000, the first resin and the second resin may be mixed to obtain a plastic material with good toughness. This plastic material is particularly suitable for forming the housing of the electronic device by the in-mold decoration process. According to an embodiment of the present disclosure, the molecular weight of the PC in the first resin is more than the molecular weight of the PC in the second resin. Thus, the second resin containing the low molecular weight PC is mixed with the first resin containing the high molecular weight PC to adjust the toughness of the first resin. Thus, the plastic material including the first resin and the second resin can have good toughness, liquidity and mechanical strength.

According to an embodiment of the present disclosure, a mass ratio of the first resin and the second resin is more than 1:1. That is, a mass of the first resin in the plastic material is more than a mass of the second resin in the plastic material. When the mass ratio is high, and the content of the first resin is far more than that of the second resin, the toughness of the plastic material will become poor. Thus, the sheet or the ink layer may be affected during the in-mold injection molding process. When the mass ratio is small, and the content of the second resin is far more than that of the first resin, the liquidity of the plastic material will become excellent. Thus, a relatively complicated structure cannot be formed by the in-mold decoration process. When the mass ratio of the first resin and the second resin is more than 1:1, the toughness of the plastic can be improved, and the hardness, the mechanical strength and other performances of the plastic material can suitable for the in-molding decoration process.

Figure 11:
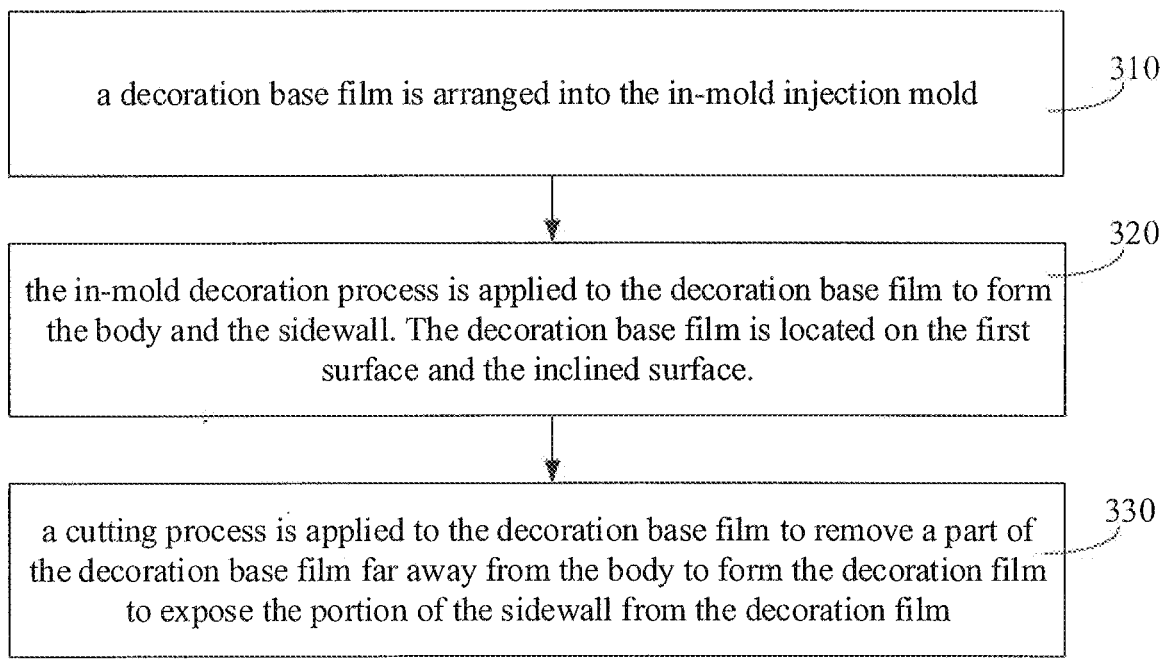
FIG. 11 illustrates a flowchart of a method for manufacturing a housing according to a third embodiment of the present disclosure.

FIG. 11 illustrates a flowchart of a method for manufacturing a housing of the third embodiment of the present disclosure. The method of the third embodiment is similar to the method of the second embodiment except the step of the decoration film for exposing the portion of the sidewall.

Figures 12, 13:
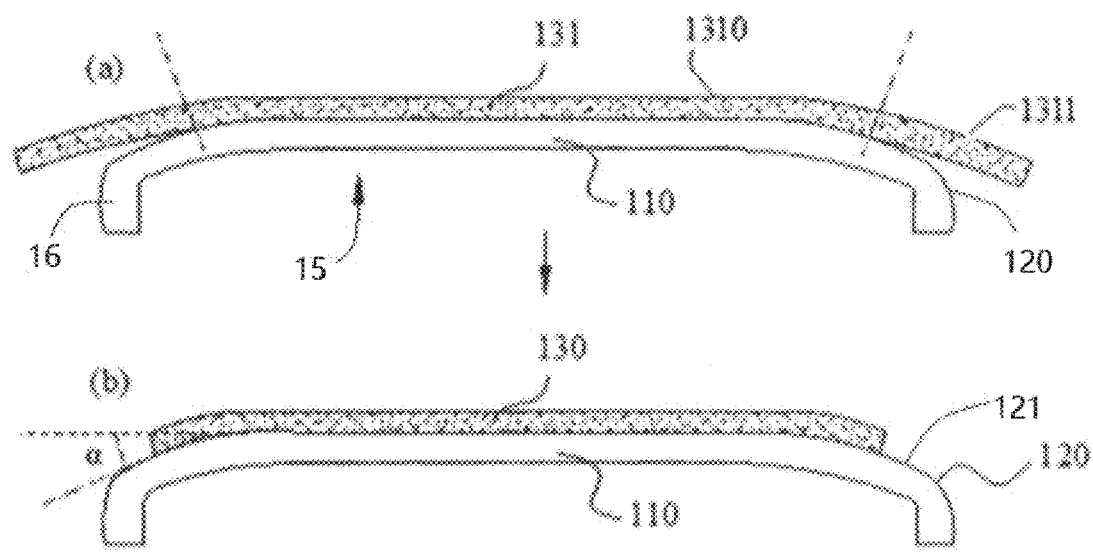
FIG. 12 illustrates a structural schematic flowchart of a method for manufacturing a housing according to the third embodiment of the present disclosure.
FIG. 13 illustrates a flowchart of a method for manufacturing a housing according to a fourth embodiment of the present disclosure.

As illustrated in FIG. 11 and FIG. 12, the second surface 160 includes an extending surface 120 connected to the inclined surface 121, applying the in-mold decoration process to the decoration film to form the body and the sidewall may further include the following steps.

At block 310, a decoration base film is arranged into the in-mold injection mold.

At block 320, the in-mold decoration process is applied to the decoration base film to form the body and the sidewall. The decoration base film is located on the first surface and the inclined surface.

At block 330, a cutting process is applied to the decoration base film to remove a part of the decoration base film far away from the body to form the decoration film to expose the portion of the sidewall from the decoration film.

After block 310 and block 320, as illustrated in FIG. 12, especially in FIG. 12(a), the decoration base film 131 is adhered to the first surface 110, and the decoration base film 131 is larger than the decoration film 130 in size.

In the present embodiment, the decoration base film 131 may include a first part 1310 and a second part 1311. The first part 1310 may contact the first surface 110 and a part of the sidewall 16. The second part 1311 is connected to the first part 1310. The second part 1311 is far away from the body 15 and is located above the sidewall 16. The second part 1311 cannot contact the sidewall 16 completely, especially, the second part 1311 cannot be adhered to the extending surface 120. A boundary of the first part 1310 and the second part 1311 is not particularly limited.

At block 330, as illustrated in FIG. 12, especially in FIG. 12(b), the second part 1311 can be removed from the decoration base film 131 to form the decoration film 130. The decoration film 130 may be the first part 1310 of the decoration base film 131. In one embodiment, a portion of the second part 1311 far away from the first part 1310 can be removed. Thus, the decoration film 130 may be a combination of the first part 1310 and a portion of the second part 1311 connected to the first part 1310. A cutting position can be can be related to, but not limited to, the included angle α defined between the first surface 110 and an extension line of the tangent line at a cutting point on the inclined surface 121 corresponding to the boundary of the decoration film 130. The included angle α is either equal to or less than 90 degrees.

FIG. 13 illustrates a flowchart of a method for manufacturing a housing of the fourth embodiment of the present disclosure. The method of the fourth embodiment is different from the method of manufacturing the preformed housing of the second embodiment.

Figure 14:
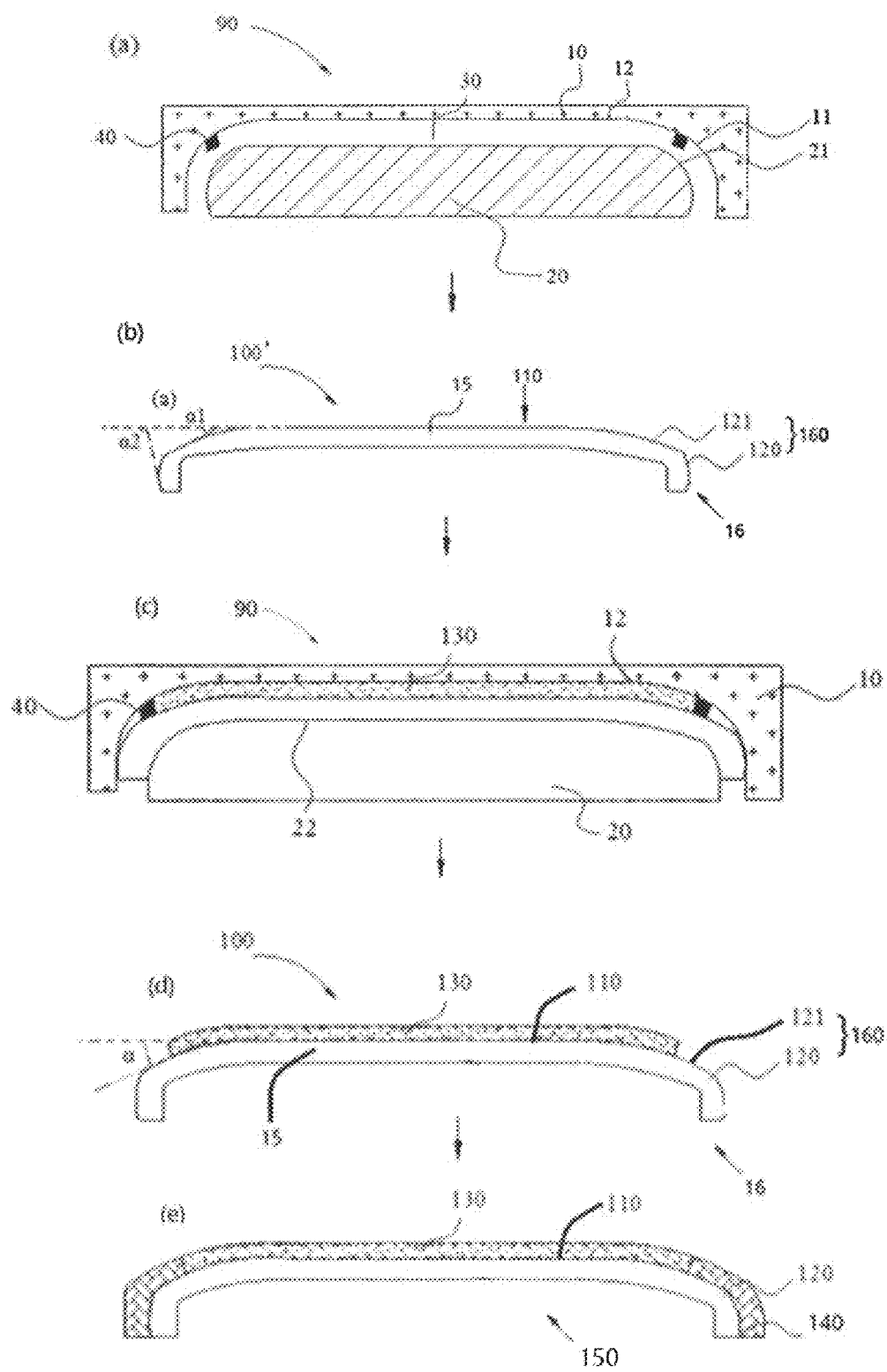
FIG. 14 illustrates a structural schematic flowchart of a method for manufacturing a housing according to the fourth embodiment of the present disclosure.

As illustrated in FIGS. 13 and 14, manufacturing the preformed housing including a decoration film may begin at block 410 include the following steps.

At block 410, an initial housing including the body and the sidewall connected to the edge of the body is provided.

At block 420, an in-mold decoration process is applied to the initial housing to form the decoration film disposed on the body and the sidewall.

In the present embodiment, the decoration film 130 can be directly formed on a predetermined area of the prepared initial housing 100', Therefore, the decoration film 130 can be simply formed without the cutting process. The decoration film 130 can be matched with another layers or structures (such as a decoration film covering the exposed portion of the sidewall) by another surface treatment. The housing 150 can have good appearance.

It is understood that, like the method of the first embodiment, a decoration structure can be formed on the exposed portion of the sidewall 16 by another injection molding process.

In the present embodiment, the decoration film 130 is directly formed on the inclined surface 121 by an in-mold decoration process. The quality of the decoration film 130 can be enhanced. The decoration film 130 may have a relatively regular boundary by an in-mold injection mold with a separating element. The in-mold injection mold may have the same configuration as the in-mold injection mold of the second embodiment. The separating element may have the same configuration as the positioning element 40 of the second embodiment. The separating element in the fourth embodiment is configured to keep the material of the decoration film 130 from flowing into the surface other than the first surface 110.

Figure 15:
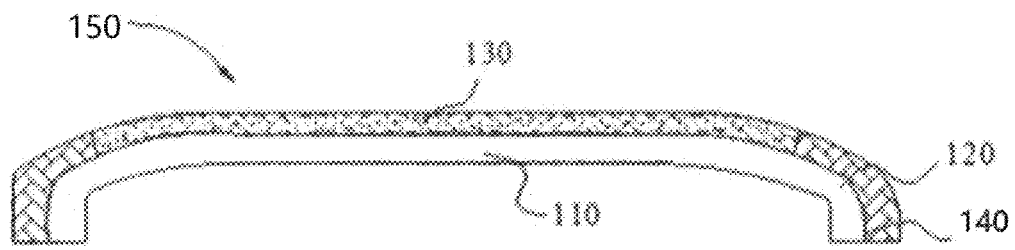
FIG. 15 illustrates a schematic view of a housing according to a fifth embodiment of the present disclosure.

The present disclosure further relates to a housing 150 according to a fifth embodiment. FIG. 15 illustrates the housing 150. The housing 150 can be used for an electronic device and is manufactured by the method according to the any of the first, the second and the third embodiment of the present disclosure. Thus, the housing 150 has all the characteristics and the advantages of the aforementioned manufacturing method. The characteristics and the advantages are not further described herein.

Figure 16:
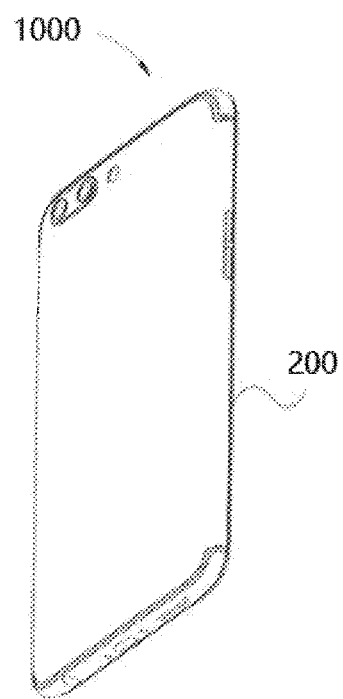
FIG. 16 illustrates a schematic view of an electronic device according to a sixth embodiment of the present disclosure.

The present disclosure further relates to an electronic device 1000 according to a sixth embodiment. As illustrated in FIG. 16, the electronic device 1000, which includes a housing 200, a screen, a main board, and a memory (not shown in the figure). The housing 200 may be manufactured by the aforementioned method. The main board and a memory are arranged in the housing 200. The screen is assembled with the housing 200 and coupled to the mainboard.

While the disclosure has been described in terms of what is presently considered to be the most practical and preferred embodiments, it is to be understood that the disclosure needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A housing, comprising:
   a body, the body having a first surface;
   a sidewall connected to an edge of the body, the sidewall having a second surface, the second surface extending from the first surface, the first surface and the second surface are non-coplanar, wherein the second surface comprises an inclined surface and an extending surface, the inclined surface is directly connected to the first surface and tilts away from the first surface, the extending surface is directly connected to the inclined surface and tilts to a bottom of the body, an included angle between the extending surface and the first surface is larger than an included angle between the inclined surface and the first surface;
- a decoration film formed on the body and a portion of the sidewall, the other portion of the sidewall being exposed from the decoration film, the other portion of the sidewall comprising the extending surface and a portion of the inclined surface; and
- a decoration layer formed on the exposed portion of the sidewall, the decoration layer having an appearance matched with the decoration film and being connected to the decoration film smoothly;
- wherein the decoration film and the decoration layer are respectively formed in two individual processes.

2. The housing of claim 1, wherein the included angle between the first surface and the inclined surface is a constant value.

3. The housing of claim 1, wherein the extending surface is perpendicular to the first surface.

4. The housing of claim 1, wherein the material of the body is different from the material of the decoration film.

5. The housing of claim 1, wherein a plastic material of the body and the sidewall comprises polycarbonate.

6. The housing of claim 5, wherein the plastic material is made of a first resin and a second resin by a hot melt extrusion process, and the molecular weight of the first resin is more than the molecular weight of the second resin.

7. The housing of claim 6, wherein the second resin comprises polycarbonate, and the molecular weight of the polycarbonate in the second resin is in a range from 20,000 to 50,000.

8. The housing of claim 6, wherein the first resin is a blend of polycarbonate and acrylonitrile butadiene styrene.

9. The housing of claim 7, wherein the molecular weight of the polycarbonate in the first resin is more than the molecular weight of the polycarbonate in the second resin.

10. The housing of claim 6, wherein a mass ratio of the first resin and the second resin is more than 1:1.

11. The housing of claim 1, wherein the sidewall surrounds the body and extends away from the body.

12. The housing of claim 1, wherein the first surface of the body is a plane.

13. The housing of claim 1, wherein the decoration film has a regular boundary at which the decoration layer is connected to.

14. The housing of claim 1, wherein the inclined surface and the extending surface are arc surfaces.

15. The housing of claim 1, wherein the included angle between the inclined surface and the first surface is equal to or less than 90 degrees, and the included angle between the extending surface and the first surface is more than 90 degrees.

16. The housing of claim 1, wherein the decoration film is a transparent sheet.

17. A housing, comprising:
- a body, the body having a first surface;
- a sidewall connected to an edge of the body, the sidewall having a second surface, the second surface extending from the first surface, the first surface and the second surface are non-coplanar, wherein the second surface comprises an inclined surface and an extending surface, the inclined surface is directly connected to the first surface and tilts away from the first surface, the extending surface is directly connected to the inclined surface and tilts to a bottom of the body, an included angle between the extending surface and the first surface is larger than an included angle between the inclined surface and the first surface;
- a decoration film formed on the body and the sidewall with an exposed portion of the sidewall left; and
- a decoration layer formed on the exposed portion of the sidewall to be connected to the decoration film, the decoration layer having an appearance matched with the decoration film and being connected to the decoration film smoothly.

18. The housing of claim 17, wherein the included angle between the first surface and the inclined surface is a constant value.

19. The housing of claim 17, wherein the extending surface is perpendicular to the first surface.

* * * * *